Figure 1:
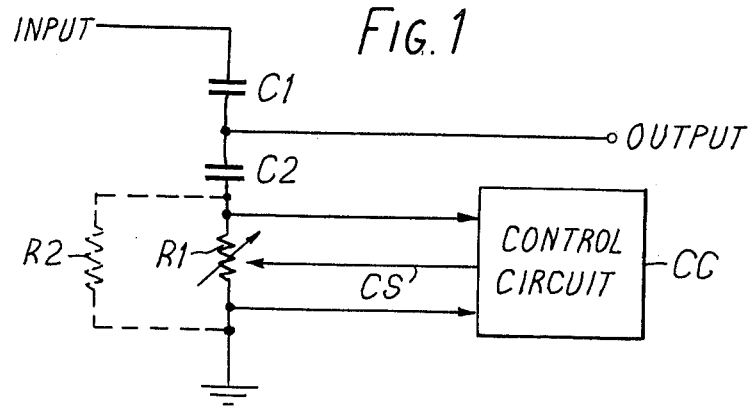

United States Patent [19]
Dolby

[11] 3,934,190
[45] Jan. 20, 1976

[54] SIGNAL COMPRESSORS AND EXPANDERS

[75] Inventor: Ray Milton Dolby, London, England

[73] Assignee: Dolby Laboratories, Inc., New York, N.Y.

[22] Filed: Oct. 31, 1974

[21] Appl. No.: 519,631

Related U.S. Application Data
[63] Continuation of Ser. No. 395,280, Sept. 7, 1973.

[30] Foreign Application Priority Data
Sept. 15, 1972 United Kingdom............... 42981/72

[52] U.S. Cl........................ 323/8; 179/1 P; 323/79; 333/14
[51] Int. Cl.² ......................................... H04B 1/64
[58] Field of Search...... 333/14, 17, 18, 28 R, 28 T; 179/1 P; 328/162, 171; 323/8, 79, 22 R, 22 T

[56] References Cited
UNITED STATES PATENTS

| | | | |
|---|---|---|---|
| 2,606,971 | 8/1952 | Scott.................................. | 333/18 |
| 3,206,556 | 9/1965 | Bachman et al. ................. | 333/14 X |
| 3,268,815 | 8/1966 | Banach ............................ | 333/18 X |
| 3,361,975 | 1/1968 | Rorden ............................ | 333/14 X |
| 3,497,721 | 2/1970 | Dexter ............................ | 328/171 X |
| 3,795,876 | 3/1974 | Takahashi et al. .................... | 333/14 |

Primary Examiner—Paul L. Gensler
Attorney, Agent, or Firm—Robert F. O'Connell

[57] ABSTRACT

Compressors and expanders for effecting dynamic range modification are constructed by connecting reactive networks in series for voltage dividing action or in parallel for current dividing action. The output signal is derived from the voltage across or current through one of the networks which includes a series or parallel variable resistance. The variable resistance is controlled in dependence upon the voltage thereacross in the sense required to achieve compression or expansion, as the case may be. The resistance change shifts a turnover frequency of the circuit so as to exclude large amplitude components from the amplitude increase or reduction which is applied to low level components within a restricted frequency band to create the compressor or expander action.

22 Claims, 7 Drawing Figures

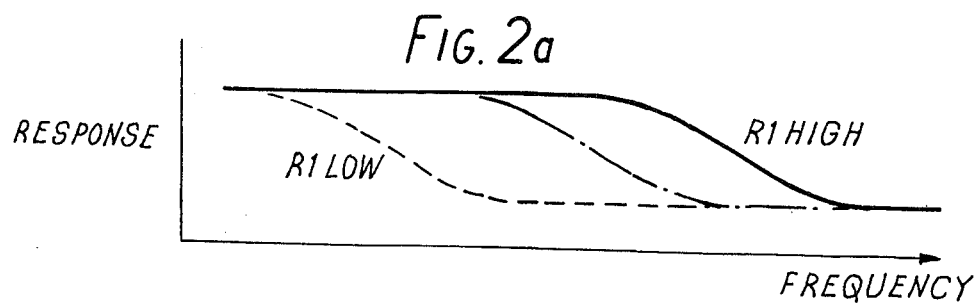
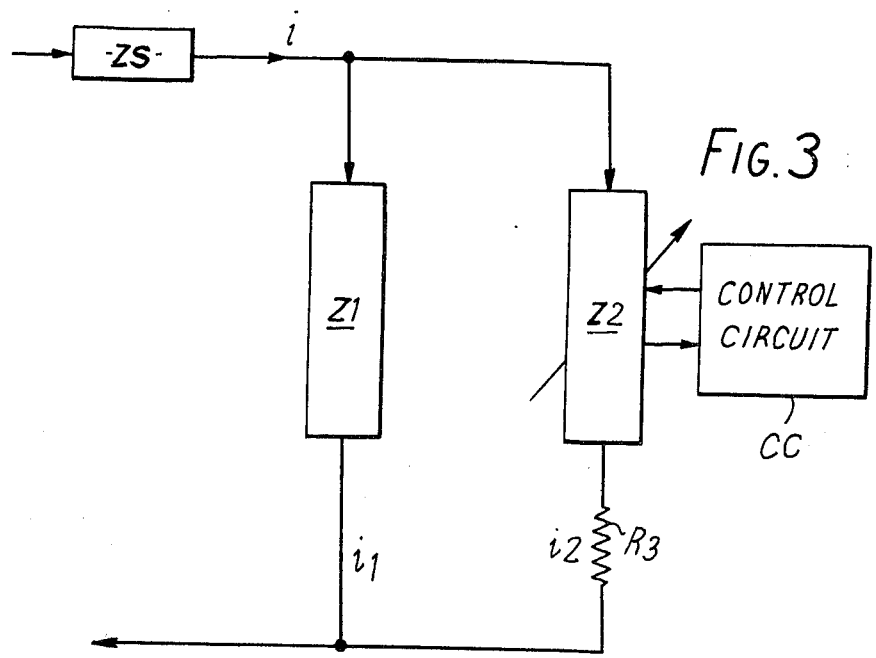

SIGNAL COMPRESSORS AND EXPANDERS

This is a continuation of application Ser. No. 395,280, filed on Sept. 7, 1973.

This invention relates to signal compressors and expanders and concerns an improvement in the invention disclosed in the specification of my co-pending application Ser. No. 232,113 corresponding to British Patent Application No. 6747/71.

The circuits described in the aforementioned specification utilize a plurality of series connected impedance networks which are voltage or current driven in response to an input signal. An output signal is derived from the voltage across or current through at least one of the networks and at least one of the networks is a frequency selective network determining a restricted frequency band within which modification of dynamic range (compression or expansion) takes place. The frequency selective network includes variable circuit means which respond to an increase in the level of a signal component within the restricted band in such a way as to narrow the restricted band and thereby exclude the increased level component therefrom. This action creates a compressor or expander characteristic in a way which will be explained below.

The circuits described in the said specification utilize relatively complex impedance networks and one object of the present invention is to provide circuits which can be of very simple form, and which may require as the said networks only two reactive impedances (i.e. capacitors or inductors) and one resistance network, (although the networks can be made more complex if the designer so requires). The circuits are designed to allow noise reduction facilities to be incorporated in inexpensive tape recorders and other equipment.

The present invention exists in two analogous forms, depending upon when the circuit is voltage or current driven.

According to the present invention in one aspect, there is provided a circuit for modifying the dynamic range of a signal, comprising an input terminal coupled to an output terminal through a first reactive impedance, the output terminal being connected to a point of reference potential through the series combination of a second reactive impedance and a variable resistance network, whose resistance is responsive to the level of a signal in the circuit to change the value of the resistances as the said level increases, in such a sense as to exclude increased level signal components from the dynamic range modification.

According to the present invention in another aspect, there is provided a circuit for modifying the dynamic range of a signal, comprising a signal source including series impedance and feeding a parallel combination of a plurality of impedance networks, and means for deriving an output signal from one of the networks, at least one of the networks serving to create a frequency selective characteristic determining a restricted frequency band within which the modification of dynamic range takes place and including variable circuit means responsive to the level of one or more signals in the circuit to narrow the restricted band as the level of such signals increases.

Figure 1A:
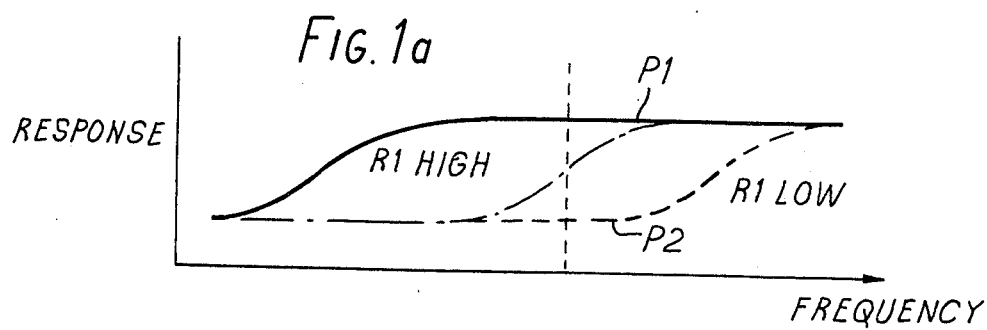
Figure 2:
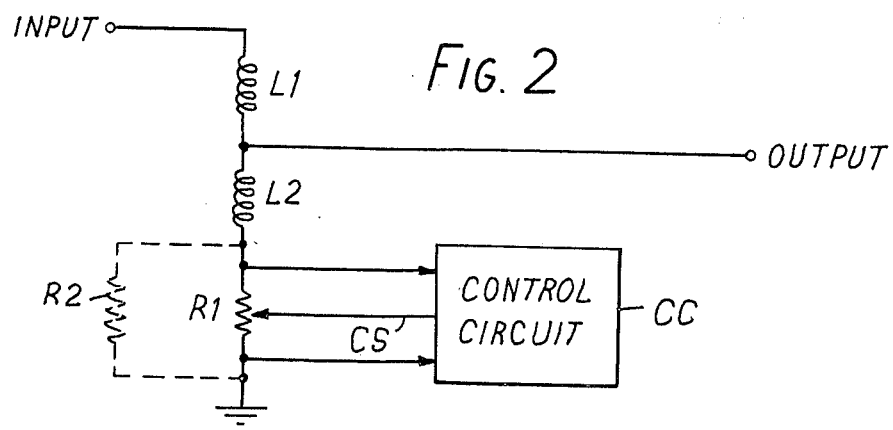
Figure 4:
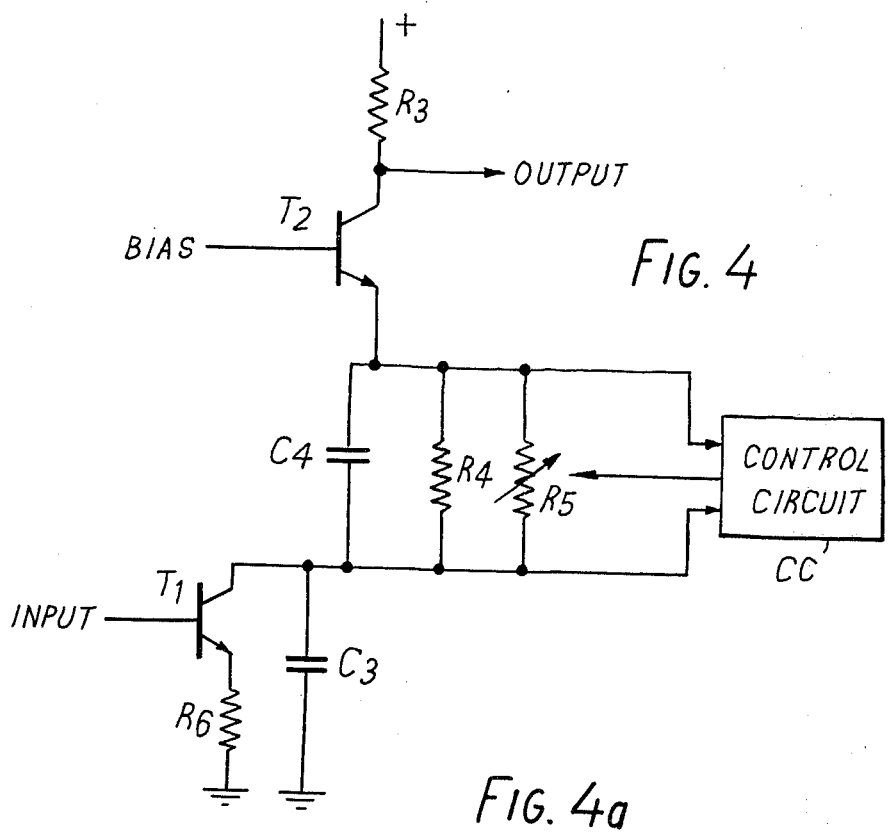
Figure 4A:
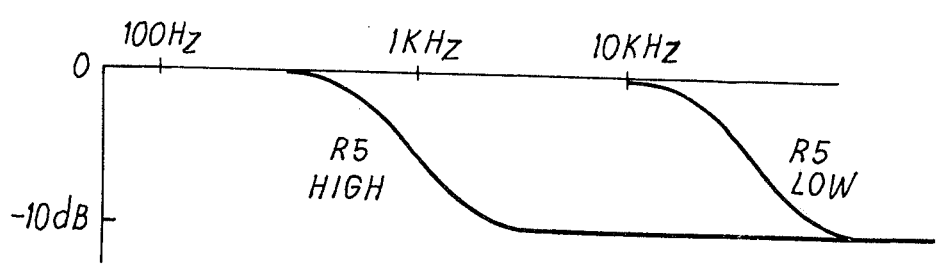

The invention will now be described in more detail, by way of example, with reference to the accompanying drawings, in which:

FIGS. 1 to 4 show four circuits embodying the invention; and FIGS. 1a, 2a and 4a are corresponding characteristic curves for the embodiments of FIGS. 1, 2 and 4.

FIG. 1 shows a voltage driven circuit which can be operated either as a high frequency compressor (e.g. as part of a hiss noise reduction system), or as a low frequency expander (e.g. as part of a rumble noise reduction system). In the illustrated circuit, first and second reactive impedances are capacitors C1 and C2 and a series resistive network consists of a variable resistance R1. A control circuit CC senses the voltage across the resistive network and produces a rectified and smoothed control signal on a line CS which controls the value of R1. R1 can be, for example, a transistor, an FET or a light sensitive resistor illuminated by a lamp which is energised by the control signal.

If the circuit is to be used as a high frequency compressor, the value of R1 is reduced as the mean voltage thereacross increases. When R1 has a high value, the circuit has a response characteristic versus frequency as shown in full lines in FIG. 1a. As the value of R1 drops, the characteristic shifts through the broken line showing to the dashed line showing. Compressor action arises, at a frequency $f$ for example as follows. When the signal level is low, (e.g. $-30$ dB), the amplitude response at $f$ is high, namely at point P1, at which there may be a 10 dB boost, for example. When the signal level at $f$ is high, (e.g. at the maximum level of 0dB), the characteristic shifts upwardly and the response at $f$ is low, namely at point P2, at which there is no boost. The change between these extreme situations is progressive and the progressive removal of the 10 dB boost as the signal level rises clearly creates a compressor characteristic.

The compressor of FIG. 1 can be used with a complementary expander to effect noise reduction in a high frequency band, e.g. high frequency tape noise reduction. One suitable expander will be described below with reference to FiG. 2. The resistor R1 preferably has a fixed resistor R2 in parallel with it in order to provide a definite low frequency limit, e.g. 1 kHz, above which the compression takes place in the circuit of FIG. 1.

The circuit of FIG. 1 can be used as a low frequency expander by making the value of R1 increase as the mean voltage thereacross rises. Even at low signal levels, R1 should still have a value sufficient to provide a definite high frequency limit (e.g. a few hundred Hertz) below which the expansion takes place. If necessary, a further resistor in series with R1 can be employed for this purpose.

If, as shown in FIG. 2, C1 and C2 are replaced by inductors L1 and L2, a preferential low pass action is substituted for the preferential high pass action of FIG. 1, the characteristics thus being as in FIG. 2a. Therefore, the circuit of FIG. 2 can be used for high frequency expansion or low frequency compression.

The circuits of FIGS. 1 and 2 operate by the principle of voltage division. Circuits operating analogously by the principle of current division will now be described. FIG. 3 shows a general circuit employing just two parallel impedance branches Z1 and Z2 as an example. Any current $i$ is fed into the network from a current source (or from a voltage source with series impedance ZS) and will divide between the two branches in accordance with their relative impedance. If the branch currents are $i_1$ and $i_2$, it can be seen that $i_1 = Z2i/(Z1 + Z2)$ and $i_2 = Z1i/(Z1 + Z2)$ since the higher impedance branch will carry the lower current, and vice versa.

The output can be derived from either one of the two branches and is proportional to $i_1$ or $i_2$ as the case may be. As shown, a small resistor R3 in series with Z2 is used to pick off an output voltage proportional to $i_2$.

Both branches can be variable as a function of the signal level but preferably one branch has fixed characteristics and only the other is variable. As illustrated, a control circuit CC varies Z2 in dependence upon the current therethrough. As in the embodiments of FIGS. 1 and 2, the same circuit can yield compressor or expander action, depending upon the sense in which Z2 is varied when the current therethrough increases. Furthermore, if, for example, a compressed signal is obtained by taking the output from $i_2$, an expanded signal can be obtained by taking the output from $i_1$.

The control of the variable branch Z2 is desirably such that dynamic range modification is confined to low level signal components, e.g. components below −20 dB, in order to avoid distortion and other undesirable effects on high level signals.

The impedances Z1 and Z2 can be very simple, such as capacitances, resistances and inductances although complex networks, including active networks can be used if required.

FIG. 4 shows one more detailed embodiment of the circuit of FIG. 3, a high frequency expander circuit being illustrated. A transistor T1 with emitter resistor R6 provides a source of signal current $i$ which is distributed between the two parallel impedance branches which are the fixed branch C3 and the variable branch comprising C4, R4 and R5. The output signal is derived from the current $i_2$ in the variable branch, the transistor T2 serving as a current to voltage converter. The control circuit cc responds to the voltage across the variable branch. The source impedance ZS is provided by T1.

At low frequencies the capacitive reactances of C3 and C4 are high. Thus, essentially, all of the input current passes through resistors R4 and R5 to provide the output signal. At very low levels the resistor R5 has a very high value. At high frequencies, at which the capacitive reactance of C4 is much lower than R4, the input current will be divided between C3 and C4 in accordance with their capacitance ratio. If $C3 = 2.16 \times C4$, for example, then most of the high frequency current will be shunted through C3 and the current through C4 will be 10 dB less than the input current, thereby providing high frequency expansion. For high level, high frequency signals the control circuit reduces the value of R5, which causes the turnover frequency to shift upwards and narrow the band in which expansion takes place, as is illustrated in FIG. 4a.

An alternative circuit may be constructed by replacing the capacitors C3 and C4 by inductors.

Any of the compressors or expanders in accordance with this invention can be placed in the negative feedback loop of a high gain amplifier to produce a complementary characteristic.

I claim:

1. A circuit for modifying the dynamic range of a signal, comprising an input terminal and an output terminal, a first reactive impedance coupling said input terminal to said output terminal, an intermediate terminal, a second reactive impedance coupling said output terminal to said intermediate terminal, and a variable resistance network coupled between said intermediate terminal and a point of reference potential, said first and second impedances being of like nature such that the impedance and voltage ratios of the impedance between said input and output terminals and the voltage produced thereacross, respectively, to the impedance between said output and intermediate terminals and the voltage produced thereacross are frequency independent, the resistance of the variable resistance network being responsive to the level of a signal in the circuit to change the value of the resistance as the said level increases, in such a sense as to exclude increased level signal components from the dynamic range modification.

2. A circuit according to claim 1, wherein said variable resistance network comprises a variable resistance in parallel with a fixed resistance.

3. A circuit according to claim 1, wherein said variable resistance network comprises a variable resistance in series with a fixed resistance.

4. A circuit according to claim 1, wherein the first and second reactive impedances are both capacitances.

5. A circuit according to claim 4, wherein the value of said resistance is arranged to fall as the voltage thereacross tends to increase.

6. A circuit according to claim 4, wherein the value of said resistance is arranged to rise as the voltage thereacross increases.

7. A circuit according to claim 1, wherein the first and second reactive impedances are both inductances.

8. A circuit according to claim 7, wherein the value of said resistance is arranged to rise as the voltage thereacross increases.

9. A circuit according to claim 7, wherein the value of said resistance is arranged to fall as the voltage thereacross tends to increase.

10. A circuit for modifying the dynamic range of a signal, comprising a signal source including series impedance so as to act as a current source, a parallel combination of a plurality of impedance networks fed from said source to form a current-dividing arrangement, and means for deriving an output signal from the current through one of the networks, at least one of the networks serving to create a frequency selective characteristic determining a restricted frequency band within which the modification of dynamic range takes place and including variable circuit means responsive to the level of one or more signals in the circuit to narrow the restricted band as the level of such signals increases.

11. A circuit according to claim 10, wherein the said one or more signals are signals within the restricted band, whereby the circuit excludes such components from dynamic range modification.

12. A circuit according to claim 10, wherein said networks comprise a first network consisting of a fixed first reactance and a second network consisting of a fixed second reactance shunted by a variable resistance network.

13. A circuit according to claim 12, wherein said variable resistance network comprises a variable resistance in parallel with a fixed resistance.

14. A circuit according to claim 12, wherein said variable resistance network comprises a variable resistance in series with a fixed resistance.

15. A circuit according to claim 12, wherein said means for deriving an output signal derive an output signal from the current through said second network.

16. A circuit according to claim 12, wherein said means for deriving an output signal derive an output signal from the current through said first network.

17. A circuit according to claim 12, wherein the first and second reactances are both capacitances.

18. A circuit according to claim 17, wherein the resistance of said variable resistance network is arranged to fall as the voltage thereacross tends to increase.

19. A circuit according to claim 17, wherein the resistance of said variable resistance network is arranged to rise as the voltage thereacross increases.

20. A circuit according to claim 12, wherein the first and second reactances are both inductances.

21. A circuit according to claim 20, wherein the resistance of said variable resistance network is arranged to fall as the voltage thereacross tends to increase.

22. A circuit according to claim 20, wherein the resistance of said variable resistance network is arranged to rise as the voltage thereacross increases.

* * * * *